US008224637B1

(12) United States Patent
Sowards et al.

(10) Patent No.: US 8,224,637 B1
(45) Date of Patent: Jul. 17, 2012

(54) METHOD AND APPARATUS FOR MODELING TRANSISTORS IN AN INTEGRATED CIRCUIT DESIGN

(75) Inventors: Jane W. Sowards, Fremont, CA (US); Shuxian Wu, San Jose, CA (US); Kaiman Chan, Fremont, CA (US)

(73) Assignee: Xilinx, Inc., San Jose, CA (US)

( * ) Notice: Subject to any disclaimer, the term of this patent is extended or adjusted under 35 U.S.C. 154(b) by 971 days.

(21) Appl. No.: 11/732,194

(22) Filed: Apr. 2, 2007

(51) Int. Cl.
*G06F 17/50* (2006.01)
(52) U.S. Cl. .......................................................... 703/14
(58) Field of Classification Search ..................... 703/14
See application file for complete search history.

(56) References Cited

U.S. PATENT DOCUMENTS

| 3,987,476 | A | * | 10/1976 | Sittig ............................. 257/118 |
| 5,933,359 | A | * | 8/1999 | Sawahata ........................... 716/2 |
| 6,286,126 | B1 | * | 9/2001 | Raghavan et al. ................. 716/6 |
| 6,449,754 | B1 | * | 9/2002 | You et al. ............................ 716/5 |
| 2004/0034517 | A1 | * | 2/2004 | Adler et al. ...................... 703/14 |
| 2009/0288048 | A1 | * | 11/2009 | Moroz et al. ....................... 716/4 |

OTHER PUBLICATIONS

Watts et al.; Netlisting and Modeling Well-Proximity Effects; IEEE Transactions on Electron Devices, vol. 53, No. 9, Sep. 2006; pp. 2179-2186.*
Drennan et al.; Implications of Proximity Effects for Analog Design; IEEE 2006 Custom Integrated Circuits Conference (CICC); pp. 1-8, 2006.*
Hook et al., "Lateral Ion Implant Stranggle and Mask Proximity Effect", IEE Trans. on Electron Devices, Sep. 2003, pp. 1946-1951, vol. 50, No. 9.
"Assura Physical Verification Command Reference", LVS Commands, Jan. 2005, pp. 638-641, Product Version 3.1.

* cited by examiner

*Primary Examiner* — Hugh Jones
(74) *Attorney, Agent, or Firm* — Robert M. Brush; John J. King

(57) ABSTRACT

An aspect of the invention relates to modeling a transistor in an integrated circuit design. Layout data for the integrated circuit design is obtained. A geometry relating the transistor to at least one well edge of at least one implant well is extracted from the layout data. An effective well proximity value for the transistor is calculated based on the at least one well edge using a complementary error function. The transistor is modeled using the effective well proximity value. In one embodiment, the effective well proximity value is added to a post-layout extracted netlist for the integrated circuit design. The integrated circuit design may be simulated using the post-layout extracted netlist. The effective well proximity value may be used to calculate a threshold voltage for the transistor during the step of simulating the integrated circuit.

19 Claims, 8 Drawing Sheets

METHOD AND APPARATUS FOR MODELING TRANSISTORS IN AN INTEGRATED CIRCUIT DESIGN

FIELD OF THE INVENTION

One or more aspects of the invention relate to electronic circuit design and, more particularly, to a method and apparatus for modeling transistors in an integrated circuit design.

BACKGROUND OF THE INVENTION

In complementary metal oxide semiconductor (CMOS) integrated circuit design, the proximity of a transistor (e.g., a field effect transistor (FET)) to an edge of an implanted well affects its threshold voltage. This effect is known as the well proximity effect. The well proximity effect is due to some of the ions in the implantation process scattering from the edge of the photoresist mask and being implanted in the silicon surface near the mask edge. The well proximity effect is particularly inherent in deep sub-micron CMOS process technology. In general, the closer a transistor is to a well edge, the more the threshold voltage is affected. Furthermore, if more than one well edge is present, the well proximity effect is cumulative.

FIG. 1 shows an exemplary graph 100 generally illustrating the well proximity effect. The graph 100 includes an axis 102 representing the distance of the transistor from the edge of an implanted well, and an axis 104 representing a change in threshold voltage of the transistor. A curve 106 generally depicts the change in threshold voltage versus distance from the well edge. When the transistor is relatively far from the edge, there is little or no change in threshold voltage due to well proximity effect. As the transistor is moved closer to the well edge, the threshold voltage changes in a non-linear fashion. The shape of the curve 106 is dictated by, among other factors, the type of transistor (e.g., n-mos FET or p-mos FET) and the thickness of the gate oxide (e.g., thickox, midox, thinox, etc.).

The well proximity effect should be accounted for during analysis of a circuit design in order to generate functional designs. Accordingly, there exists a need in the art for a method and apparatus for modeling transistors in an integrated circuit design that accounts for the well proximity effect.

SUMMARY OF THE INVENTION

An aspect of the invention relates to modeling a transistor in an integrated circuit design. Layout data for the integrated circuit design is obtained. A geometry relating the transistor to at least one well edge of at least one implant well is extracted from the layout data. An effective well proximity value for the transistor is calculated based on the at least one well edge using a complementary error function. The transistor is modeled using the effective well proximity value. In one embodiment, the effective well proximity value is added to a post-layout extracted netlist for the integrated circuit design. The integrated circuit design may be simulated using the post-layout extracted netlist in some embodiments. The effective well proximity value may be used to calculate a threshold voltage for the transistor during the step of simulating the integrated circuit in some embodiments.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Method and apparatus for modeling transistors in an integrated circuit design is described. One or more aspects of the invention relate to complementary metal oxide semiconductor (CMOS) circuit designs having n-mos and p-mos field effect transistors (FETs). In one embodiment, an effective well proximity value is determined for each transistor in a circuit design based on physical layout data using a complementary error function. For a given transistor, the effective well proximity value combines a model of well proximity behavior with the specific layout of the transistor. In one embodiment, the inventive process for determining effective well proximity values is implemented within a circuit design system. The circuit design system is illustratively described below as a computer aided design (CAD) system.

Figure 2:
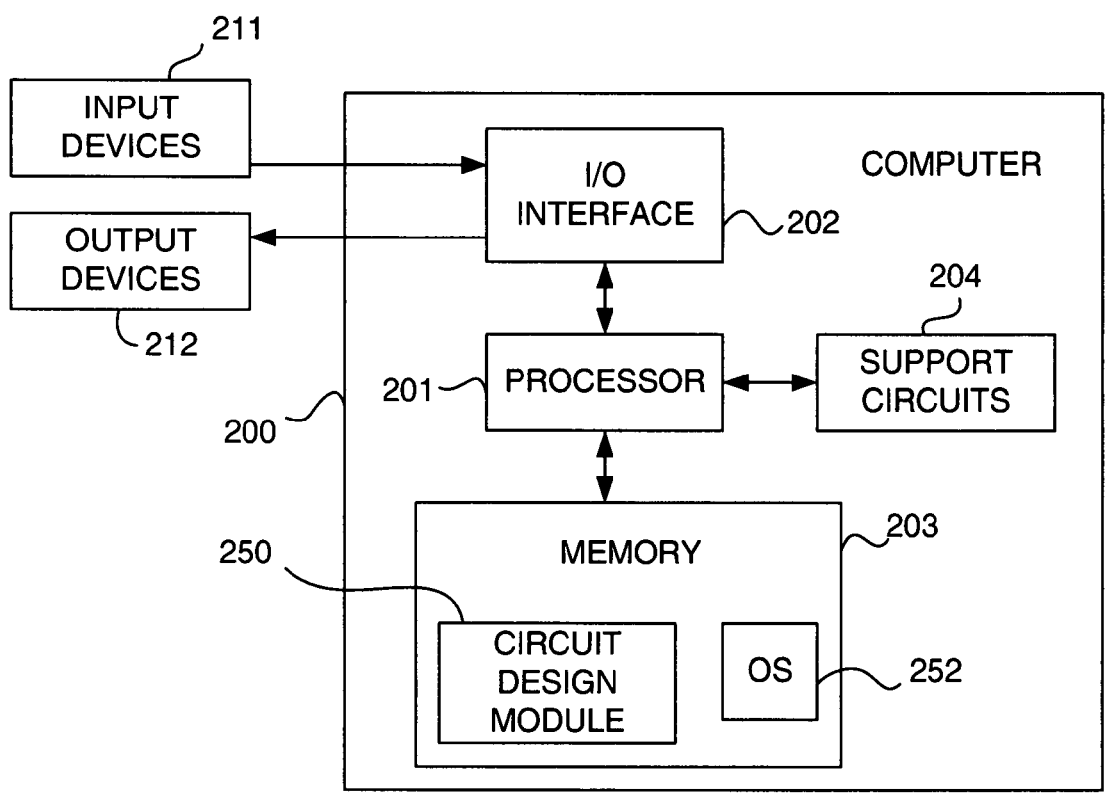
FIG. 2 is a block diagram depicting an exemplary embodiment of a computer suitable for implementing the processes described herein in accordance with one or more aspects of the invention.

In particular, FIG. 2 is a block diagram depicting an exemplary embodiment of a computer 200 suitable for implementing the processes described herein in accordance with one or more aspects of the invention. The computer 200 includes a processor 201, a memory 203, various support circuits 204, and an I/O interface 202. The processor 201 may include one or more microprocessors known in the art. The support circuits 204 for the processor 201 include conventional cache, power supplies, clock circuits, data registers, I/O interfaces, and the like. The I/O interface 212 may be directly coupled to the memory 203 or coupled through the processor 201. The I/O interface 202 is coupled to various input devices 211 (e.g., keyboard, mouse, and the like) and output devices 212 (e.g., display, printer, and the like).

The memory 203 stores processor-executable instructions and/or data that may be executed by and/or used by the processor 201. These processor-executable instructions may comprise hardware, firmware, software, and the like, or some combination thereof. Modules having processor-executable instructions that are stored in the memory 203 include circuit design module 250. The computer 200 may be programmed with an operating system 252, which may be, for example, OS/2, Java Virtual Machine, Linux, Solaris, Unix, Windows, Windows95, Windows98, Windows NT, and Windows2000, WindowsME, WindowsXP, Windows Vista, and MacOS among other known platforms. At least a portion of an operating system may be disposed in the memory 203. The memory 203 may include one or more of the following random access memory, read only memory, magneto-resistive read/write memory, optical read/write memory, cache memory, magnetic read/write memory, and the like, as well as signal-bearing media as described below.

Figure 3:
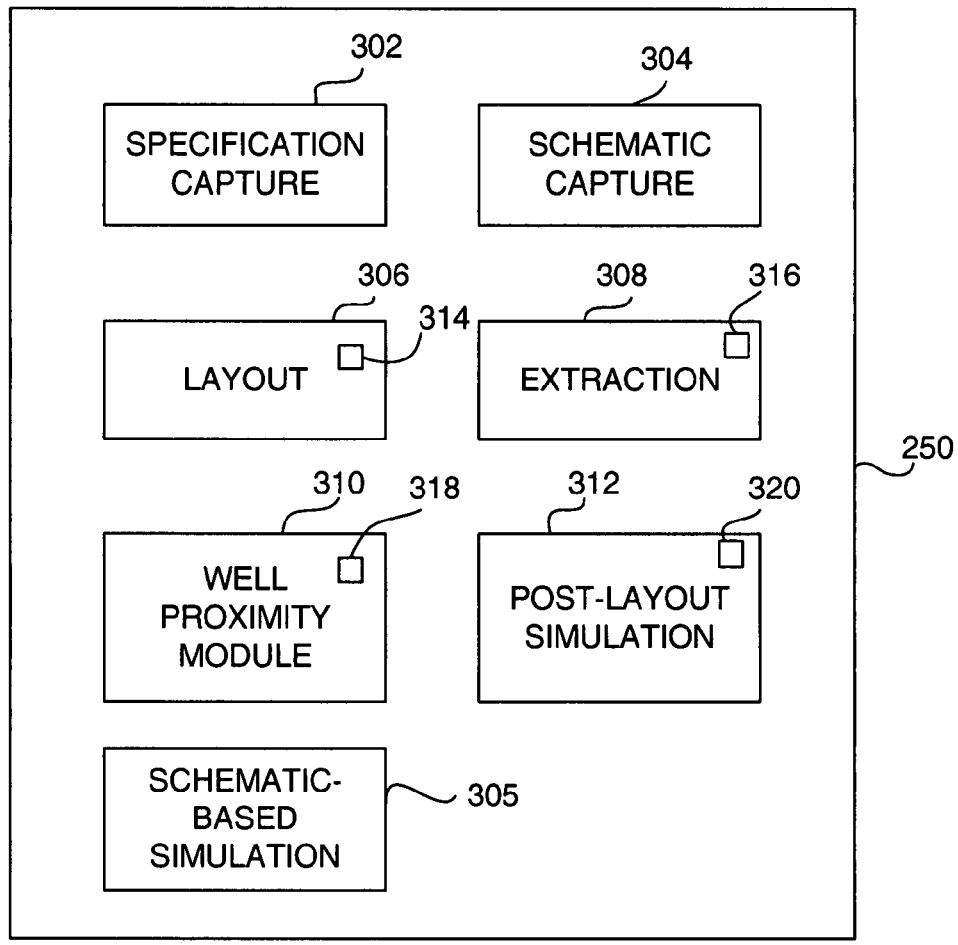
FIG. 3 is a block diagram depicting an exemplary embodiment of a circuit design module in accordance with one or more aspects of the invention.

FIG. 3 is a block diagram depicting an exemplary embodiment of the circuit design module 250 in accordance with one or more aspects of the invention. The circuit design module 250 includes a specification capture module 302, a schematic capture module 304, a schematic-based simulation module 305, a layout module 306, an extraction module 308, a well proximity module 310, and a post-layout simulation module 312. The specification capture module 302 is configured to establish a set of specifications of an integrated circuit design. The specifications typically describe the expected functionality of the circuit design and may define values for various parameters, such as maximum allowable delay times, setup and hold time, operation frequency, operation conditions, silicon area constraints, power dissipation constraints, and the like.

The schematic capture module 304 is configured to capture a transistor-level and/or gate-level description of the circuit design via a schematic editor. The schematic editor provides a mechanism for a circuit designer to draw, place, and connect individual components of the circuit design and to generate a netlist and an interface to perform circuit simulations. The schematic-based simulation module 305 simulates the electrical performance and functionality of the circuit design. The layout module 306 generates layout data 314 for the circuit design. The layout data 314 describes geometries and relative positioning of mask layers to be used in actual fabrication of integrated circuits. Notably, the layout data 314 describes a layout for each transistor in the circuit design. The layout data 314 for the circuit design may be generated manually by a circuit designer, or a layout designer, or automatically from the schematic or a hardware design language description using commercially available CAD tools.

The extraction module 308 processes the layout data 314 to generate a netlist 316. The netlist 316 is a transistor-level description of the circuit design that is used to simulate the circuit design. The netlist 316 includes physical dimensions and parasitics for the circuit design. A netlist may also be generated from the schematic description of the circuit design in the schematic capture module 304. The netlist 316 is different than such a schematic netlist, as the netlist includes layout data from the actual physical implementation. Thus, the netlist 316 may be referred to as a "post-layout netlist" or a "post-layout extracted netlist." To generate the netlist 316, the extraction module 308 identifies from the layout data 314 individual transistors and their interconnections on the various mask layers, as well as the parasitic resistances and capacitances that are inevitably present between the mask layers. Notably, the extraction module 308 extracts a geometry for each transistor layout in the layout data 314. The geometry for each transistor includes various physical dimensions, such as transistor source/drain length and width, gate length and width, and separations between edges of the gate and edges of one or more implant wells. Any of various CAD tools, including post-layout extraction tools and LVS tools, may be used to implement the extraction module 308, such as ASSURA RCX, commercially available from Cadence Design Systems, Inc. of San Jose, Calif., or Calibre, commercially available from Mentor Graphics Corp. of Wilsonville, Oreg.

The well proximity module 310 (which may be combined with extraction module 308 in some embodiments) augments the netlist 316 to include an effective well proximity value (ewp) for each of the transistors, thereby providing an augmented netlist 318. Operation of the well proximity module 310 is described below. The post-layout simulation module 312 (which may be the same as the schematic-based simulation module 305) uses the augmented netlist 318 to perform a transistor-level simulation of the circuit design. For a given transistor, the effective well proximity value generated by the well proximity module 310 can be used by a model 320 of the transistor during simulation in the post-layout simulation module 312 to calculate an increase in threshold voltage due to the well proximity effect. An exemplary post-layout simulator that can be used with the invention is HSPICE, commercially available from Synopsys, Inc. of Mountain View, Calif. Another exemplary post-layout simulator is NANOSIM/HSIM, also from Synopsys, Inc. Other simulators, including other SPICE-like simulators, may be used. The model 320 includes a well-proximity sub-circuit model and a transistor model. Generation of a well-proximity sub-circuit model is described below with respect to FIG. 9. An exemplary transistor model that can be used by the post-layout simulation module 312 is the BSIM physical MOSFET model, available from the University of California at Berkeley. Those skilled in the art will appreciate that other types of simulators and transistor models may be used with the invention.

It should be noted that the illustrated circuit design module 250 only includes those general functions of circuit design that are useful for the description of the invention. Those skilled in the art will appreciate that the circuit design module 250 may include other modules, such as a design rule check (DRC) module for checking the layout data against established design rule constraints, a layout-versus-schematic (LVS) module for checking the netlist extracted from the layout against an original netlist for the design, and the like.

Figure 4:
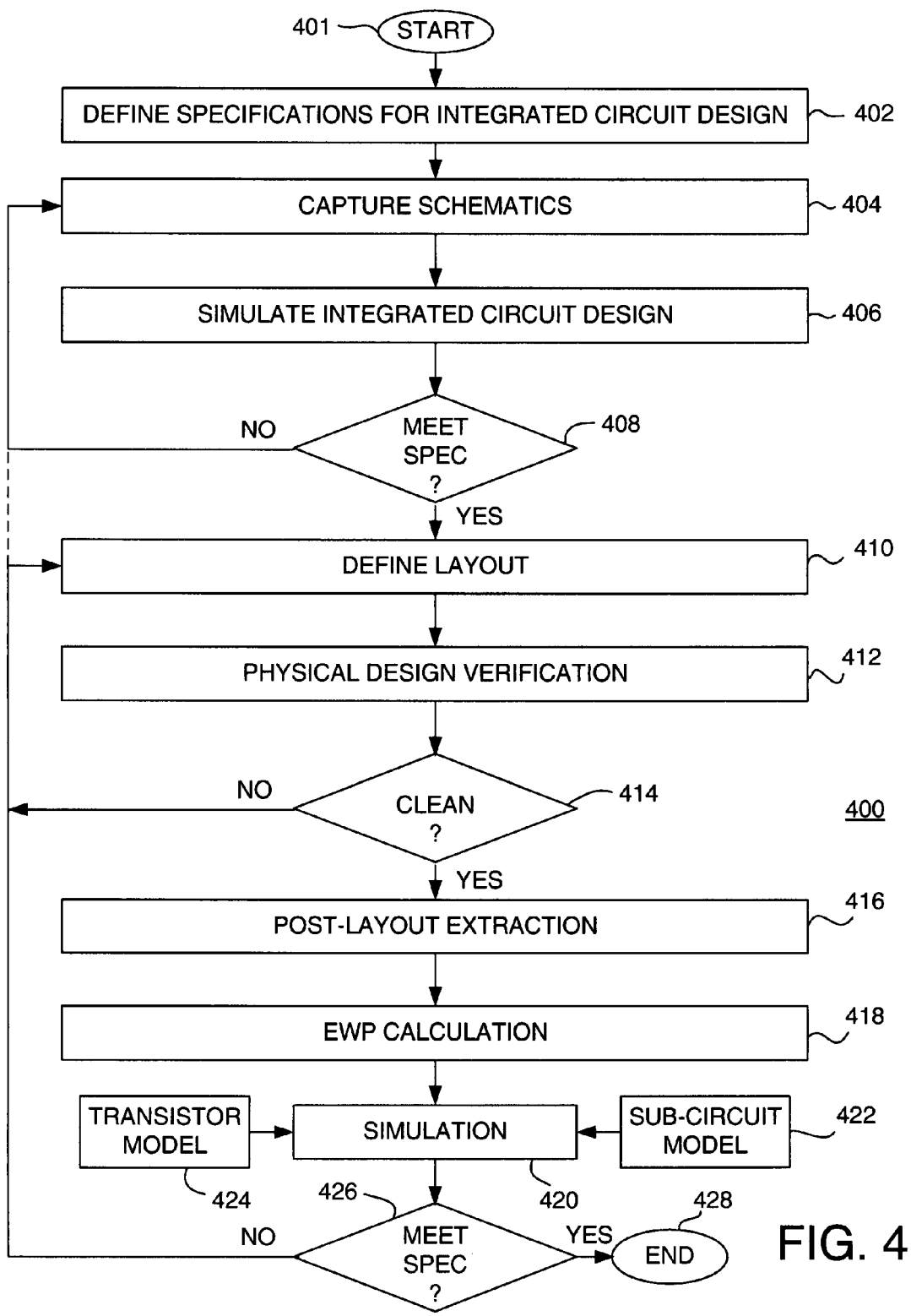
FIG. 4 is a flow diagram depicting an exemplary embodiment of a circuit design method in accordance with one or more aspects of the invention.

FIG. 4 is a flow diagram depicting an exemplary embodiment of a method 400 of circuit design in accordance with one or more aspects of the invention. The method 400 begins at step 401. At step 402, specifications for the integrated circuit design are specified. At step 404, schematics for the circuit design are captured. At step 406, the integrated circuit design is simulated using a netlist generated from the schematic description of the circuit design. At step 408, a determination is made whether the circuit design meets the specifications. If not, the method 400 returns to step 404, where the schematic description is modified. Otherwise, the method 400 proceeds to step 410.

At step 410, a layout for the circuit design is produced. At step 412, the physical design is verified. For example, design rule checks, layout-versus-schematic checks, electrical rule checks, and the like may be performed. At step 414, a determination is made whether the results from the verifications meet checking criteria (i.e., whether the design is "clean"). If not, the method 400 returns to step 410, where the layout is modified. Alternatively, the method 400 may return to step 404, where the schematic description is modified. If at step 414 the design is clean, the method 400 proceeds to step 416.

At step 416, post-layout extraction is performed to generate a post-layout netlist. At step 418, effective well proximity values are computed for the transistors and the post-layout netlist is augmented with the values. At step 420, the physical design is simulated using the post-layout netlist having the effective well proximity values. The post-layout simulation uses a transistor model 424 (e.g., BSIM) and a well-proximity sub-circuit model 422 (described below). At step 426, a determination is made whether the physical design as simulated meets specifications. If not, the method 400 returns to step 410, where the layout of the design is modified. Alternatively, the method 400 may return to step 404, where the schematic description is modified. If at step 426 the physical design as simulated meets the specifications, the method 400 ends at step 428.

Figure 5:
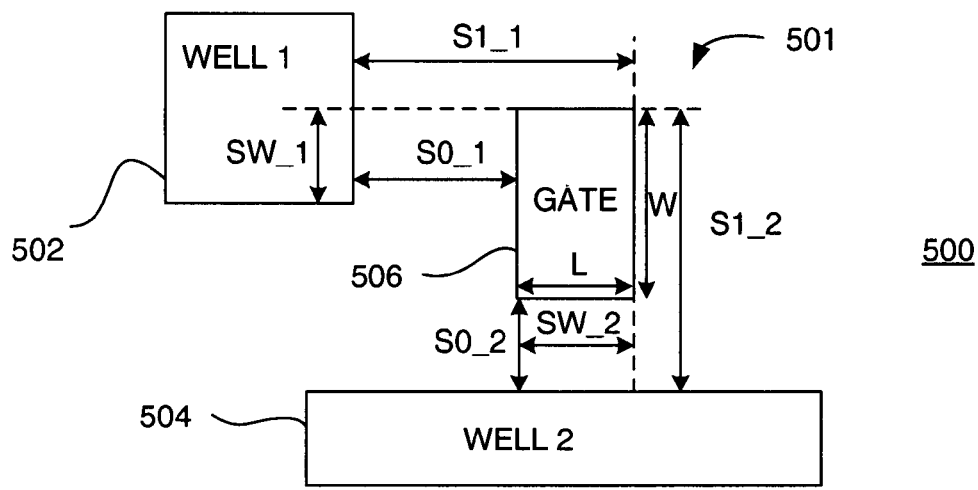
FIG. 5 is plan view showing an exemplary embodiment of a transistor layout.

Operation of the well proximity module 310 may be understood with reference to the following examples. FIG. 5 is plan view showing an exemplary embodiment of a transistor layout 500. The transistor layout 500 includes a transistor 501 having gate 506. Other elements of the transistor 501 are omitted for clarity (e.g., source region, drain region). The transistor 501 is in proximity with an implant well 502 and an implant well 504. For simplicity, an implant well is hereinafter referred to simply as a well. The wells 502 and 504 may be n-type wells or p-type wells, depending on whether the transistor is an p-mos device or a n-mos device. The invention is applicable to both n-mos and p-mos transistors and thus the wells 502 and 504 are shown generally without respect to type.

For a given edge of a well, an effective well proximity value (ewp) is computed as follows:

$$ewp = \frac{sw}{W} \cdot \text{erfc}\left(\frac{s0 + s1}{2}\right) \quad (1)$$

if the transistor is parallel to the well edge; and $$ewp = \frac{sw}{L} \cdot \text{erfc}\left(\frac{s0 + s1}{2}\right) \quad (2)$$

if the transistor is perpendicular to the well edge.
The quantity sw is the projected length from the gate to the well edge; the quantities L and W are the length and width, respectively, of the transistor; the quantity s0 is the near separation of the gate to the well edge; the quantity s1 is the far separation of the gate to the well edge; and erfc denotes a complementary error function. A given transistor may be proximate one or more well edges. Thus, an overall ewp value is determined by summing the individual ewp values for each of the well edges. For clarity, a given transistor is deemed to have an ewp value that comprises a sum of one or more ewp components respectively associated with one or more well edges. The length and width of the transistor may be defined as the length and width of the gate.

An error function is a non-elementary function that occurs in probability. A generalized error function, $\text{erf}_n(x)$, may be defined as follows:

$$\text{erf}_n(x) = \frac{n!}{\sqrt{\pi}} \int_0^x e^{-t^n} dt \text{ for } n > 0. \quad (3)$$

A complementary error function, erfc, is defined in terms of an error function such that:

$$\text{erfc}_n(x) = 1 - \text{erf}_n(x). \quad (4)$$

Figure 1:
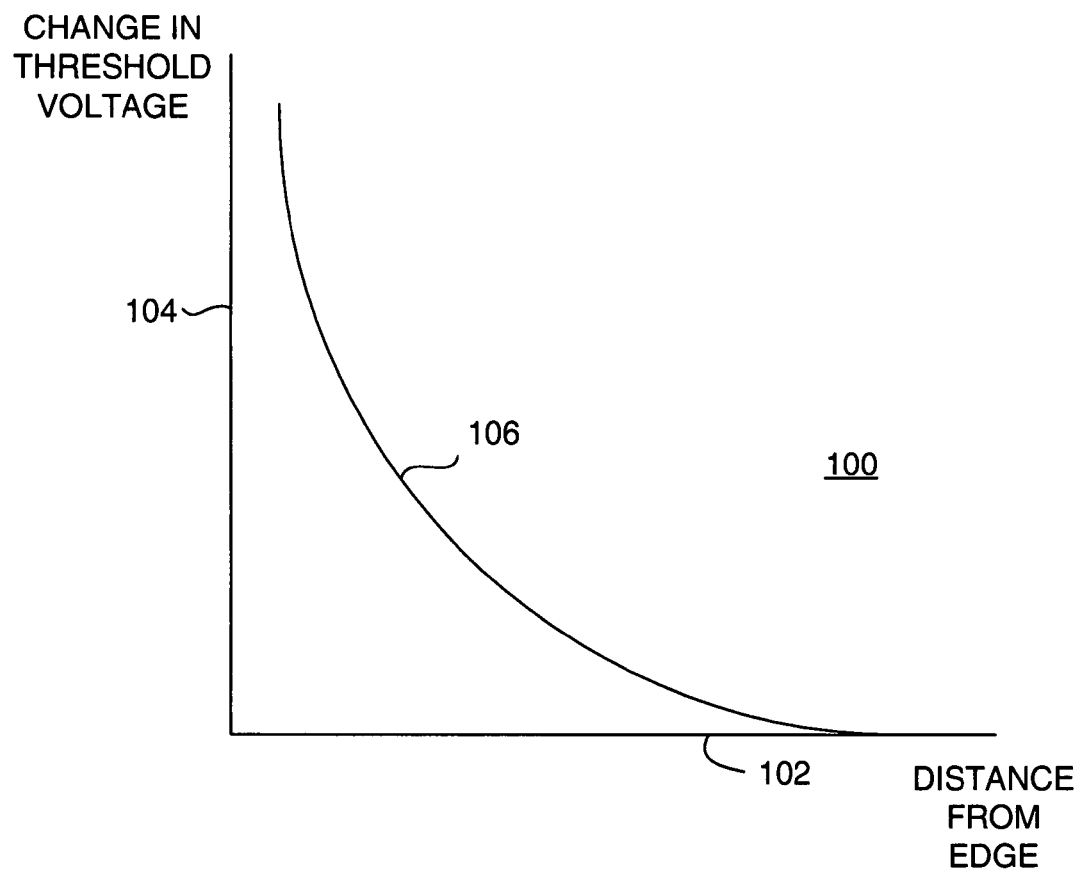
FIG. 1 shows an exemplary graph generally illustrating the well proximity effect.
Figure 10:
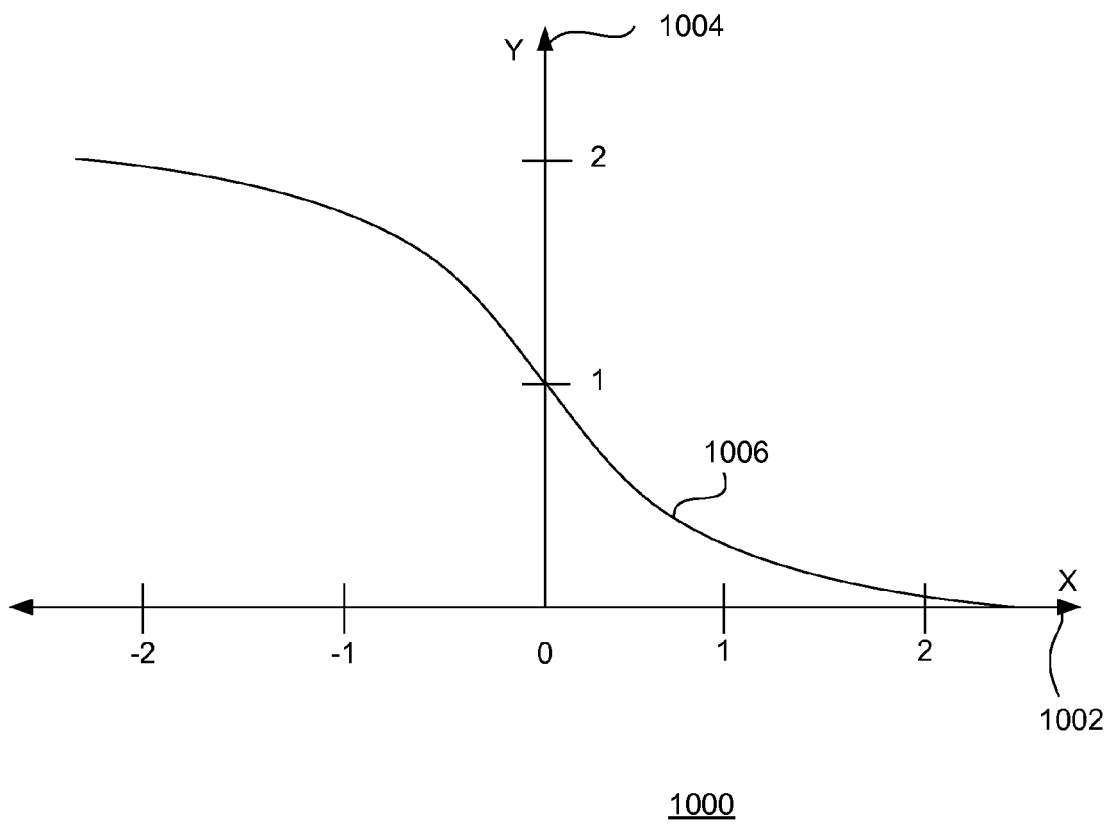
FIG. 10 is a graph illustrating the complement of the Gauss error function.

In one embodiment, the erfc used in equations (1) and (2) above is the complement of the Gauss error function. The Gauss error function is defined as $\text{erf}_2(x)$. FIG. 10 is a graph 1000 illustrating the complement of the Gauss error function. The graph 1000 includes an axis 1002 representing the x-argument, and an axis 1004 representing the value of $\text{erfc}_2(x)$. As shown, a curve 1006 is near zero when x is greater than two, and near two when x is less than negative two. When x is zero, $\text{erfc}_2(x)$ is one. Notably, the complement of the Gauss error function is advantageously used in the present embodiment due to the similarity between the well proximity behavior curve (FIG. 1) and the characteristics of the complementary Gauss error function where x is greater than minimum design rules. That is, assuming the well edge is represented by the axis 1004, nmos transistors follow the minimum design rule separation from the well edge, and pmos transistors follow the minimum design rule enclosure to the well edge, then the well proximity behavior curve of a transistor in a typical design implementation resembles the characteristics of the complementary error function.

Referring to FIG. 5, the ewp value for the transistor 501 is computed as follows: the gate 506 is in proximity with two well edges, namely, an edge of the well 502 (also referred to as well 1) and an edge of the well 504 (also referred to as well 2). The quantities sw, s0, and s1 are augmented with an "__1" for well 1, and an "__2" for well 2. Thus, for the well 502, the projected length from the gate 506 to the well edge is sw__1, the near separation of the gate 506 to the well edge is s0__1, and the far separation of the gate 506 to the well edge is s1__1. Likewise, for the well 504, the projected length from the gate 506 to the well edge is sw__2, the near separation of the gate 506 to the well edge is s0__2, and the far separation of the gate 506 to the well edge is s1__2. The gate 506 is parallel to the edge of the well 502 and thus the values sw__1, s0__1, and s1__1 are used in equation (1) along with the width of the transistor 501. The gate 506 is perpendicular to the edge of the well 504 and thus the values sw__2, s0__2, and s1__2 are used in equation (2) along with the length of the transistor 501. As a result, an ewp component is computed for each of the wells 502 and 504 with respect to the transistor 501. The ewp value for the transistor 501 is the sum of the first and second ewp components.

Figure 6:
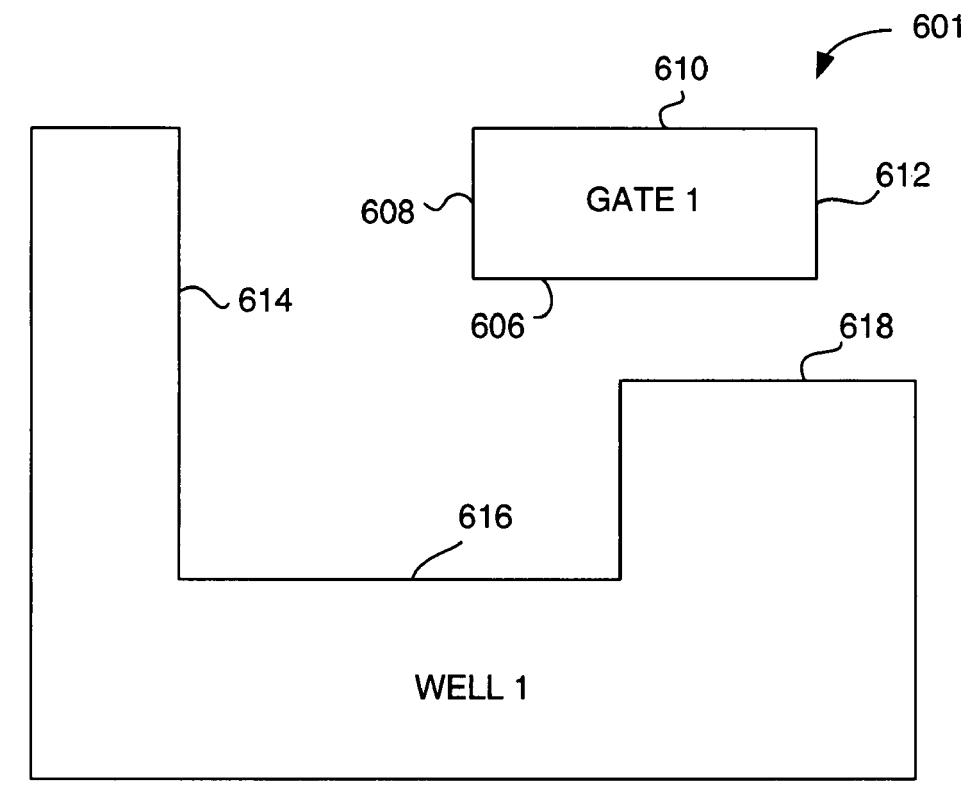
FIG. 6 is plan view showing another exemplary embodiment of a transistor layout.

The transistor layout 500 is merely exemplary, as the invention can be applied to any transistor layout. FIG. 6 is plan view showing another exemplary embodiment of a transistor layout 600. The transistor layout 600 includes a transistor 601 having a gate designated as "gate_1." Again, other elements of the transistor 601 are omitted for clarity. The transistor 601 is in proximity with a well designated as "well_1." Again, well_1 may be an n-type well or a p-type well, depending on whether the transistor 601 is an p-mos device or a n-mos device. Gate_1 includes edges 606, 608, 610, and 612. Well_1 include edges 614, 616, and 618. Gate_1 is in proximity with the edge 618, the edge 616, and the edge 614 and thus there are three ewp components to be computed. Gate_1 is perpendicular to the edge 614, and parallel to the edges 616 and 618. The ewp components are computed using equations (1) and (2) above to yield an ewp value for the transistor 601.

Figure 7:
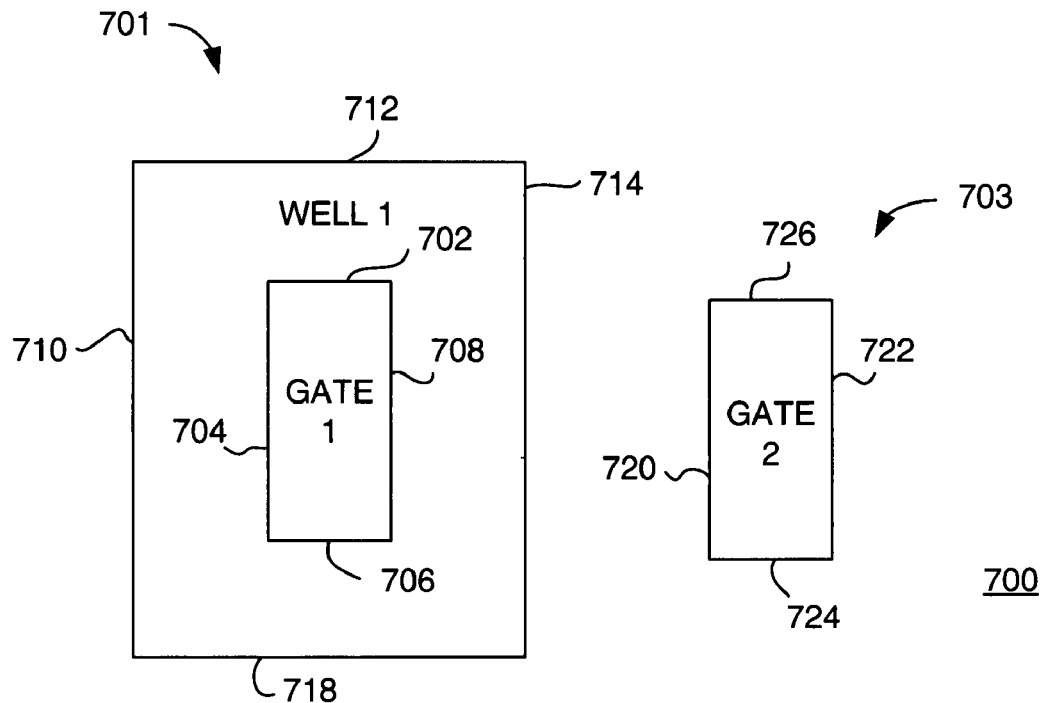
FIG. 7 is plan view showing yet another exemplary embodiment of a transistor layout.

FIG. 7 is a plan view showing yet another exemplary embodiment of a transistor layout 700. The transistor layout 700 includes a transistor 701 having a gate designated as "gate_1" and a transistor 703 having a gate designated as "gate_2." Again, other elements of the transistors 701 and 703 are omitted for clarity. The transistors 701 and 703 are in proximity with a well designated as "well_1." Again, well_1 may be an n-type well or a p-type well, depending on whether the transistors 701 and 703 are p-mos device or n-mos devices, respectively. Gate_1 includes edges 702, 704, 706, and 708. Gate_2 includes edges 720, 722, 724, and 726. Well_1 include edges 710, 712, 714, and 718.

Gate_1 is in proximity with the edges 710, 712, 714, and 718 and thus there are four ewp components to be computed for transistor 701. Gate_1 is perpendicular to the edges 712 and 718, and parallel to the edges 710 and 714. The ewp components are computed using equations (1) and (2) above to yield an ewp value for the transistor 701. Gate_2 is in proximity with the edge 714 and thus there is only one ewp component or value to be computed for the transistor 703. Gate_2 is parallel to the edge 714. The ewp value for the transistor 703 is computed using equation (1).

The transistor layouts in FIGS. 5-7 are merely exemplary. Those skilled in the art will appreciate that an ewp value can be computed in a similar manner for a myriad of other transistor layouts.

Figure 8:
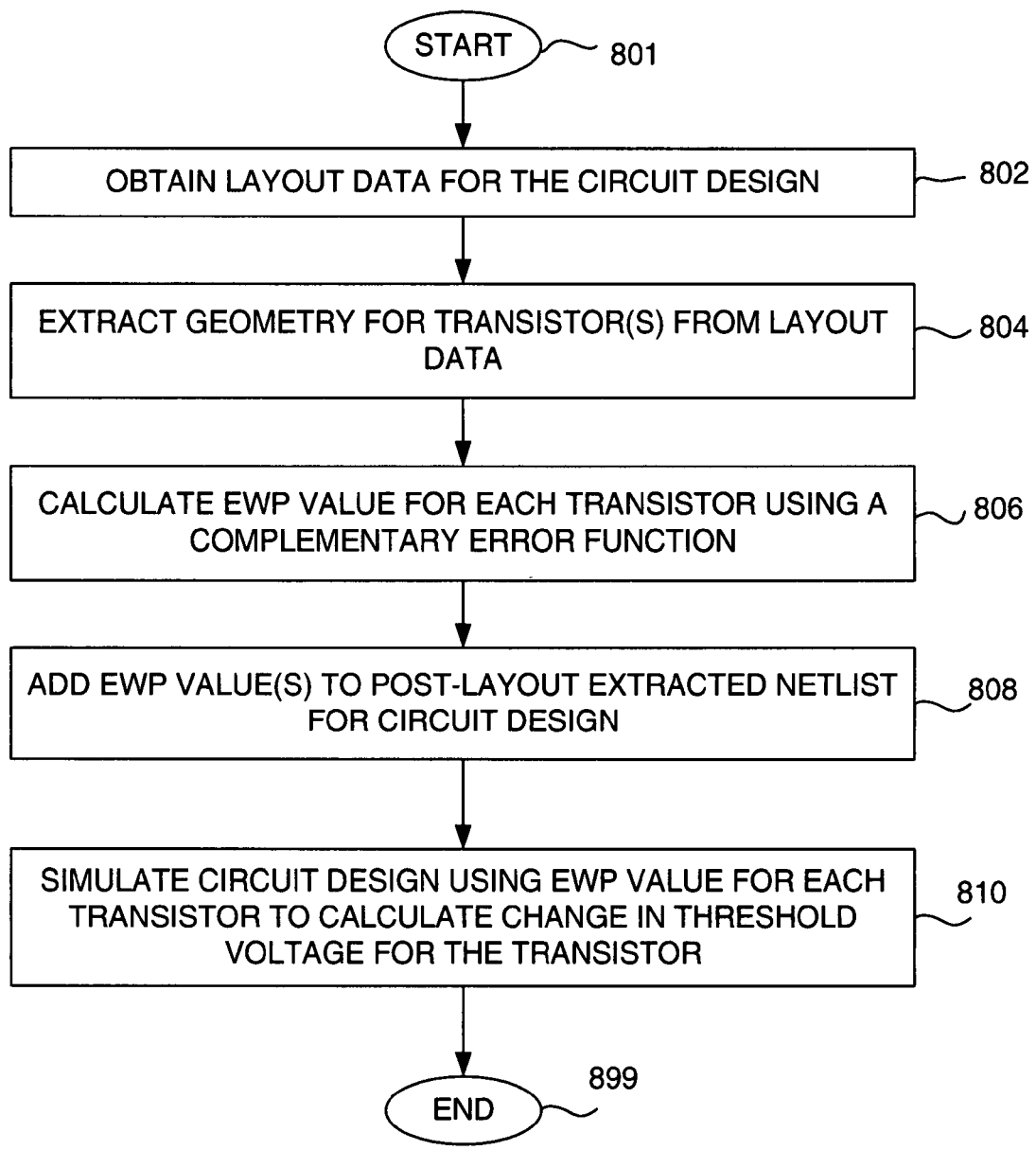
FIG. 8 is a flow diagram depicting an exemplary embodiment of a method for modeling transistors in an integrated circuit design in accordance with one or more aspects of the invention.

FIG. 8 is a flow diagram depicting an exemplary embodiment of a method 800 for modeling transistors in an integrated circuit design in accordance with one or more aspects of the invention. The method 800 begins at step 801. At step 802, layout data is obtained for the circuit design. At step 804, a geometry is extracted from the layout data that relates one or more transistors to one or more well edges of one or more wells. In one embodiment, additional parameters may be extracted from the layout data, such as width (W), length (L), area of the source region (AS), area of the drain region (AD), periphery of the source region (PS), periphery of the drain region (PD), and other typical transistor characteristics. The geometry for each transistor is indicative of the transistor layout. At step 806, an ewp value is calculated for each transistor using a complementary error function. At step 808, the effective well proximity value for each transistor is added to a post-layout extracted netlist for the integrated circuit design. At step 810, the integrated circuit design is simulated using the effective well proximity value for each transistor to calculate a change in threshold voltage for the transistor. In one embodiment, the effective well proximity value for each transistor is extracted from the post-layout extracted netlist. For each transistor, the effective well proximity value for the transistor is provided as parametric input to a sub-circuit model of the transistor to calculate the change in threshold voltage of the transistor. The method 800 ends at step 899.

Figure 9:
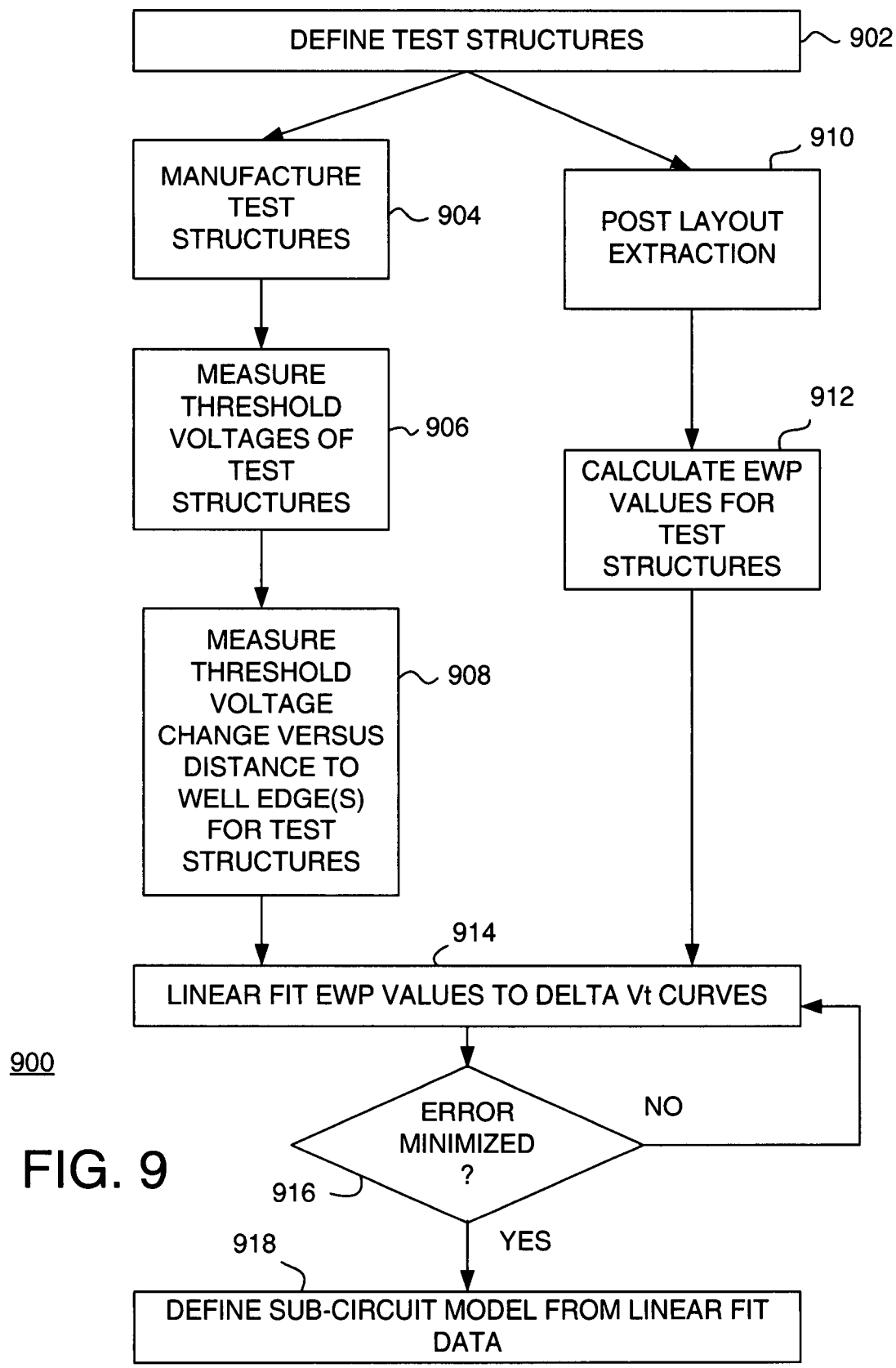
FIG. 9 is a flow diagram depicting exemplary embodiment of a method for generating a sub-circuit model of a transistor in accordance with one or more aspects of the invention.

FIG. 9 is a flow diagram depicting exemplary embodiment of a method 900 for generating a sub-circuit model of a transistor in accordance with one or more aspects of the invention. The method 900 begins at step 902, where test structures are defined. The test structures define various transistor layouts, such as those shown in FIGS. 4-6 described above. At step 904, the test structures are manufactured (i.e., produced in silicon). The process of semiconductor manufacturing is well known in the art. At step 906, threshold voltages are measured from the test structures. The process of measuring transistor threshold voltage is well known in the art. At step 908, changes in threshold voltage versus distance from well edge(s) is measured for the test structures ("delta Vt curves").

The method 900 also proceeds from step 902 to step 910, where post layout extraction is performed from the layout data for the test structures. At step 912, effective well proximity values for the test structures are calculated as described above. The method 900 proceeds from steps 908 and 912 to step 914, where the effective well proximity values are linear fitted to the delta Vt curves determined at step 908. At step 916, a determination is made whether the linear fit achieve a minimized error. Steps 914 and 916 are repeated until the error in the linear fit is minimized. At step 918, a sub-circuit model is defined from the linear fit data.

Method and apparatus for modeling transistors in an integrated circuit design has been described. In one embodiment, the invention provides a complementary error function based well proximity extraction methodology. The complementary error function provides proper weighting of the transistors with respect to implant well edges, whether the transistors are parallel or perpendicular to the well edges. The methodology works for all types of transistor layouts, from simple to complicated structures. Based on the methodology, the well proximity effect value can be automatically extracted for a transistor during the post-layout extraction flow and included in the post-layout netlist for circuit simulation. The complementary error function based extraction methodology provides an automated way to get the effective well proximity (ewp) information into the post-layout netlist so that circuits can be simulated closer to the actual silicon behavior and analyzed more accurately.

An aspect of the invention is implemented as a program product for use with a computer system. Program(s) of the program product defines functions of embodiments and can be contained on a variety of signal-bearing media, which include, but are not limited to: (i) information permanently stored on non-writable storage media (e.g., read-only memory devices within a computer such as CD-ROM or DVD-ROM disks readable by a CD-ROM drive or a DVD drive); (ii) alterable information stored on writable storage media (e.g., floppy disks within a diskette drive or hard-disk drive or read/writable CD or read/writable DVD); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct functions of the invention, represent embodiments of the invention.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

What is claimed is:

1. A method of modeling a transistor in an integrated circuit design, comprising:
 obtaining layout data for the integrated circuit design;
 extracting a geometry relating the transistor to at least one well edge of at least one implant well from the layout data;
 calculating, using a computer, an effective well proximity value for the transistor based on the at least one well edge using a complementary error function, wherein the effective well proximity value for the transistor is calculated using a distance from a gate of the transistor to the at least one well edge and a distance representing a portion of the gate of the transistor which is parallel to the at least one well edge;
 measuring a threshold voltage associated with a second transistor of a test structure; and
 simulating the integrated circuit design based upon the calculated effective well proximity value and the threshold voltage associated with the second transistor of the test structure,
wherein the response of the test structure is used to identify variations caused by integrated circuit device behavior.

2. The method of claim 1, further comprising:
adding the effective well proximity value to a post-layout extracted netlist for the integrated circuit design.

3. The method of claim 2, further comprising:
extracting the effective well proximity value for the transistor from the post-layout extracted netlist; and
providing the effective well proximity value as parametric input to a sub-circuit model of the transistor to calculate the change in threshold voltage of the transistor.

4. The method of claim 3, further comprising linear fitting changes in threshold voltages measured from test structures to effective well proximity values calculated for the test structures to form the sub-circuit model.

5. The method of claim 1, wherein the effective well proximity value comprises at least one component respectively associated with the at least one well edge, and wherein for each component of the at least one component and respective well edge of the at least one well edge, the component is calculated using:
a first function if the transistor is parallel to the respective well edge and a second function if the transistor is perpendicular to the respective well edge;
where the first function relates a projected length from the gate of the transistor to the respective well edge, a width of the transistor, and a value of the complementary error function, and the second function relates the projected length from the gate of the transistor to the respective well edge, a length of the transistor, and the value of the complementary error function.

6. The method of claim 5, wherein the at least one well edge and the at least one component comprise a plurality of well edges and a plurality of components, respectively, and wherein the effective well proximity is a sum of the plurality of components.

7. The method of claim 5, wherein the first function is defined by:

$$\frac{sw}{W} \cdot \mathrm{erfc}\left(\frac{s0+s1}{2}\right),$$

and the second function is defined by:

$$\frac{sw}{L} \cdot \mathrm{erfc}\left(\frac{s0+s1}{2}\right),$$

where sw is the projected length from the gate of the transistor to the respective well edge, s0 is a near separation of the gate to the respective well edge, s1 is a far separation of the gate to the respective well edge, W is the width of the transistor, L is the length of the transistor, and erfc is the complementary error function.

8. Apparatus for modeling a transistor in an integrated circuit design, comprising:
a computer processor;
a memory coupled to the computer processor, the memory storing:
a layout module for providing layout data for the integrated circuit design;
an extraction module for extracting a geometry relating the transistor to at least one well edge of at least one implant well from the layout data;
a well proximity module for calculating an effective well proximity value for the transistor based on the at least one well edge using a complementary error function,
wherein the well proximity module is accessed by the computer processor to calculate the effective well proximity value for the transistor using a distance from a gate of the transistor to the at least one well edge and a distance representing a portion of the gate of the transistor which is parallel to the at least one well edge;
a post-layout simulation module for measuring a threshold voltage associated with a second transistor of a test structure; and
a schematic-based simulation module for simulating the integrated circuit design based upon the calculated effective well proximity value and the threshold voltage associated with the second transistor of the test structure,
wherein the response of the test structure is used to identify variations caused by integrated circuit device behavior.

9. The apparatus of claim 8, wherein the well proximity module is further configured to:
add the effective well proximity value to a post-layout extracted netlist for the integrated circuit design.

10. The apparatus of claim 9,
wherein the post-layout simulation module is further configured to:
extract the effective well proximity value for the transistor from the post-layout extracted netlist; and
provide the effective well proximity value as parametric input to a sub-circuit model of the transistor to calculate a change in threshold voltage of the transistor.

11. The apparatus of claim 8, wherein the effective well proximity value comprises at least one component respectively associated with the at least one well edge, and wherein for each component of the at least one component and respective well edge of the at least one well edge, the component is calculated using:
a first function if the transistor is parallel to the respective well edge and a second function if the transistor is perpendicular to the respective well edge;
where the first function relates a projected length from the gate of the transistor to the respective well edge, a width of the transistor, and a value of the complementary error function, and the second function relates the projected length from the gate of the transistor to the respective well edge, a length of the transistor, and the value of the complementary error function.

12. The apparatus of claim 11, wherein the first function is defined by:

$$\frac{sw}{W} \cdot \mathrm{erfc}\left(\frac{s0+s1}{2}\right),$$

and the second function is defined by:

$$\frac{sw}{L} \cdot \mathrm{erfc}\left(\frac{s0+s1}{2}\right),$$

where sw is the projected length from the gate of the transistor to the respective well edge, s0 is a near separation of the gate to the respective well edge, s1 is a far separation of the gate to the respective well edge, W is the width of the transistor, L is the length of the transistor, and erfc is the complementary error function.

13. A non-transitory computer readable medium having instructions stored thereon that when executed by a processor cause the processor to perform a method of modeling a transistor in an integrated circuit design, comprising:

obtaining layout data for the integrated circuit design;

extracting a geometry relating the transistor to at least one well edge of at least one implant well from the layout data; and calculating an effective well proximity value for the transistor based on the at least one well edge using a complementary error function, wherein the effective well proximity value for the transistor is calculated using a distance from a gate of the transistor to the at least one well edge and a distance representing a portion of the gate of the transistor which is parallel to the at least one well edge;

measuring a threshold voltage associated with a second transistor of a test structure; and simulating the integrated circuit design based upon the calculated effective well proximity value and the threshold voltage associated with the second transistor of the test structure, wherein the response of the test structure is used to identify variations caused by integrated circuit device behavior.

14. The non-transitory computer readable medium of claim 13, wherein simulating the integrated circuit design using the effective well proximity value comprises calculating a change in threshold voltage of the transistor.

15. The non-transitory computer readable medium of claim 14, wherein the method further comprises:

adding the effective well proximity value to a post-layout extracted netlist for the integrated circuit design;

wherein the simulating comprises:

extracting the effective well proximity value for the transistor from the post-layout extracted netlist; and providing the effective well proximity value as parametric input to a sub-circuit model of the transistor to calculate the change in threshold voltage of the transistor.

16. The non-transitory computer readable medium of claim 15, wherein the method further comprises linear fitting changes in threshold voltage measured from test structures to effective well proximity values calculated for the test structures to form the sub-circuit model.

17. The non-transitory computer readable medium of claim 13, wherein the effective well proximity value comprises at least one component respectively associated with the at least one well edge, and wherein for each component of the at least one component and respective well edge of the at least one well edge, the component is calculated using:

a first function if the transistor is parallel to the respective well edge and a second function if the transistor is perpendicular to the respective well edge;

where the first function relates a projected length from the gate of the transistor to the respective well edge, a width of the transistor, and a value of the complementary error function, and the second function relates the projected length from the gate of the transistor to the respective well edge, a length of the transistor, and the value of the complementary error function.

18. The non-transitory computer readable medium of claim 17, wherein the at least one well edge and the at least one component comprise a plurality of well edges and a plurality of components, respectively, and wherein the effective well proximity is a sum of the plurality of components.

19. The non-transitory computer readable medium of claim 17, wherein the first function is defined by:

$$\frac{sw}{W} \cdot \text{erfc}\left(\frac{s0 + s1}{2}\right),$$

and the second function is defined by:

$$\frac{sw}{L} \cdot \text{erfc}\left(\frac{s0 + s1}{2}\right),$$

where sw is the projected length from the gate of the transistor to the respective well edge, s0 is a near separation of the gate to the respective well edge, s1 is a far separation of the gate to the respective well edge, W is the width of the transistor, L is the length of the transistor, and erfc is the complementary error function.

* * * * *